United States Patent
Agam et al.

(10) Patent No.: US 10,224,323 B2
(45) Date of Patent: Mar. 5, 2019

(54) ISOLATION STRUCTURE FOR SEMICONDUCTOR DEVICE HAVING SELF-BIASING BURIED LAYER AND METHOD THEREFOR

(71) Applicant: SEMICONDUCTOR COMPONENTS INDUSTRIES, LLC, Phoenix, AZ (US)

(72) Inventors: Moshe Agam, Portland, OR (US); Johan Camiel Julia Janssens, Asse (BE); Jaroslav Pjencak, Dolni Becva (CZ); Thierry Yao, Portland, OR (US); Mark Griswold, Gilbert, AZ (US); Weize Chen, Phoenix, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 22 days.

(21) Appl. No.: 15/669,579

(22) Filed: Aug. 4, 2017

(65) Prior Publication Data

US 2019/0043856 A1    Feb. 7, 2019

(51) Int. Cl.
*H01L 21/00* (2006.01)
*H01L 27/07* (2006.01)
(Continued)

(52) U.S. Cl.
CPC ........ *H01L 27/0705* (2013.01); *H01L 27/088* (2013.01); *H01L 27/098* (2013.01);
(Continued)

(58) Field of Classification Search
CPC ..... H01L 29/06; H01L 29/0696; H01L 29/10; H01L 29/1095; H01L 29/78; H01L 29/7835
See application file for complete search history.

(56) References Cited

U.S. PATENT DOCUMENTS 7,095,092 B2    8/2006  Zhu et al.
7,989,875 B2 *  8/2011  Noort ................. H01L 27/0623
                                                              257/315
(Continued)

OTHER PUBLICATIONS

Lijuan et al., A high voltage SOI pLDMOS with a partial interface equipotential floating buried layer, Journal of Semiconductors, Jul. 2013, 074009-1 thru 074009-5, vol. 34, No. 7.
Kia et al., A novel partial-SOI LDMOSFET (>800 V) with n-type floating buried layer in substrate, Microelectronics Reliability, 54, 2014, pp. 582-586, www.elsevier.com/locate/microrel.
(Continued)

*Primary Examiner* — Nicholas J Tobergte
(74) *Attorney, Agent, or Firm* — Kevin B. Jackson

(57) ABSTRACT

A semiconductor device includes a floating buried doped region, a first doped region disposed between the floating buried doped region and a first major surface, and a semiconductor region disposed between the floating buried doped region and a second major surface. A trench isolation structure extends from the first major surface and terminates within the semiconductor region and the floating buried doped region abuts the trench isolation structure. A second doped region is disposed in the first doped region has an opposite conductivity type to the first doped region. A first isolation device is disposed in the first doped region and is configured to divert current injected into the semiconductor device from other regions thereby delaying the triggering of an internal SCR structure. In one embodiment, a second isolation structure is disposed within the first doped region and is configured to disrupt a leakage path along a sidewall surface of the trench isolation structure.

20 Claims, 5 Drawing Sheets

(51) Int. Cl.
| | |
|---|---|
| *H01L 27/088* | (2006.01) |
| *H01L 27/098* | (2006.01) |
| *H01L 29/739* | (2006.01) |
| *H01L 29/06* | (2006.01) |
| *H01L 29/10* | (2006.01) |
| *H01L 29/66* | (2006.01) |
| *H01L 29/861* | (2006.01) |
| *H01L 29/78* | (2006.01) |

(52) U.S. Cl.
CPC ...... *H01L 29/0653* (2013.01); *H01L 29/1083* (2013.01); *H01L 29/66659* (2013.01); *H01L 29/7391* (2013.01); *H01L 29/861* (2013.01); *H01L 29/06* (2013.01); *H01L 29/0696* (2013.01); *H01L 29/10* (2013.01); *H01L 29/1095* (2013.01); *H01L 29/78* (2013.01); *H01L 29/7835* (2013.01)

(56) References Cited

U.S. PATENT DOCUMENTS

| | | | |
|---|---|---|---|
| 8,138,531 | B2 | 3/2012 | Adkisson et al. |
| 8,264,038 | B2 | 9/2012 | Pendharkar et al. |
| 8,338,872 | B2 | 12/2012 | Khemka et al. |
| 9,478,607 | B2 | 10/2016 | Agam et al. |
| 9,748,330 | B2 * | 8/2017 | Janssens ........... H01L 21/76224 |
| 10,026,728 | B1 * | 7/2018 | Agam ................. H01L 27/0259 |
| 10,084,039 | B2 * | 9/2018 | Janssens ........... H01L 21/76224 |
| 2015/0002967 | A1 | 1/2015 | Kawase et al. |
| 2017/0200785 | A1 | 7/2017 | Janssens |

OTHER PUBLICATIONS

Agam, Moshe et al., "Semiconductor Device Having Biasing Structure for Self-Isolating Buried Layer and Method Therefor," U.S. Appl. No. 15/497,443, filed Apr. 26, 2017.

* cited by examiner

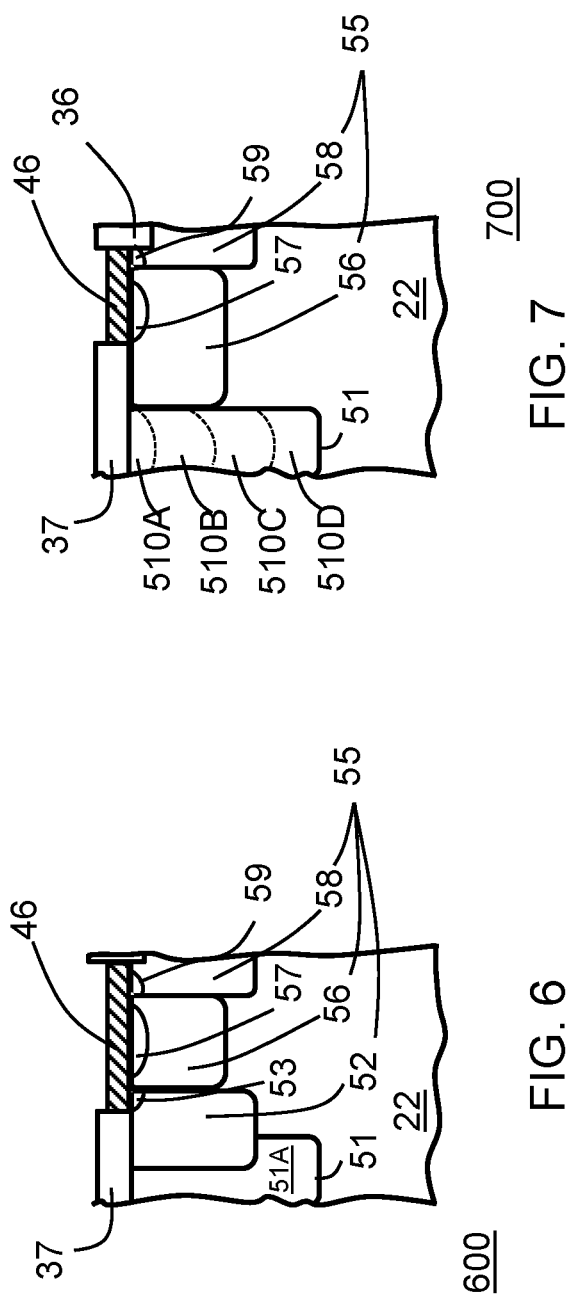

ISOLATION STRUCTURE FOR SEMICONDUCTOR DEVICE HAVING SELF-BIASING BURIED LAYER AND METHOD THEREFOR

CROSS-REFERENCE TO RELATED APPLICATIONS

Not Applicable.

BACKGROUND

The present invention relates, in general, to electronics and, more particularly, to semiconductor device structures and methods of forming semiconductor devices.

Integrated circuits have been classified as analog devices, digital devices, or power devices. Smart Power technologies combine or integrate analog and digital circuits with power devices on or within a single semiconductor substrate. The smart part of the smart power circuit adds, for example, control, diagnostic, and protection functions to the power semiconductor devices. Smart Power technologies have increased the robustness and reliability of power drivers for automotive and industrial applications. Such applications have included, for example, intelligent power switches for controlling an ABS-braking system, system power chips for airbag control, engine management, motor control, switched mode power supplies, intelligent switching of lights, among others.

The integration of logic and analog functions with power transistors on a single semiconductor die presents challenges in the isolation schemes used to physically separate and electrically isolate the different functional devices. Such isolation schemes have included, for example, junction isolation and dielectric isolation schemes. Dielectric isolation schemes have included dielectric trench isolation, which separates components in a lateral direction, but not against the substrate, as well as semiconductor-on-insulator ("SOI") schemes that provide both lateral isolation and vertical substrate isolation. Another isolation scheme has combined dielectric trench isolation with junction isolation regions that have been disposed adjoining the trench isolation regions within the active regions of the device.

However, the above noted isolation schemes have several shortcomings. For example, junction isolation schemes include doped regions that consume lateral space within the semiconductor chip, which results in larger chips sizes being used to ensure sufficient lateral spacing to sustain breakdown characteristics. Also, because of the larger area taken up by junction isolation schemes, junction isolation schemes also tend to exhibit undesirable high capacitance. SOI technologies provide for reduced chips sizes, but have had issues with thermal dissipation, high on-resistance due to larger average junction temperature, less robustness during inductive clamping, and lower energy capability during an electro-static discharge ("ESD") event, among others. In addition, in high voltage SOI technology, the parasitic capacitance per unit area of the top layer towards the underlying substrate often exceeds the capacitance per unit area presented by vertical junction isolation. Additionally, SOI technologies are expensive to manufacture.

Accordingly, it is desirable to have an isolation structure and a method of forming the semiconductor devices using the isolation structure that overcomes the shortcomings of prior isolation techniques set forth previously and that reduces the effects of parasitic currents within the resultant structure. It is also desirable for the method to be cost effective and easy to integrate into pre-existing process flows.

BRIEF DESCRIPTION OF THE DRAWINGS

FIG. 6 illustrates an enlarged partial cross-sectional view of a further embodiment of an isolation structure in accordance with the present invention;

FIG. 7 illustrates an enlarged partial cross-sectional view of another embodiment of an isolation structure in accordance with the present invention;

Figure 1:
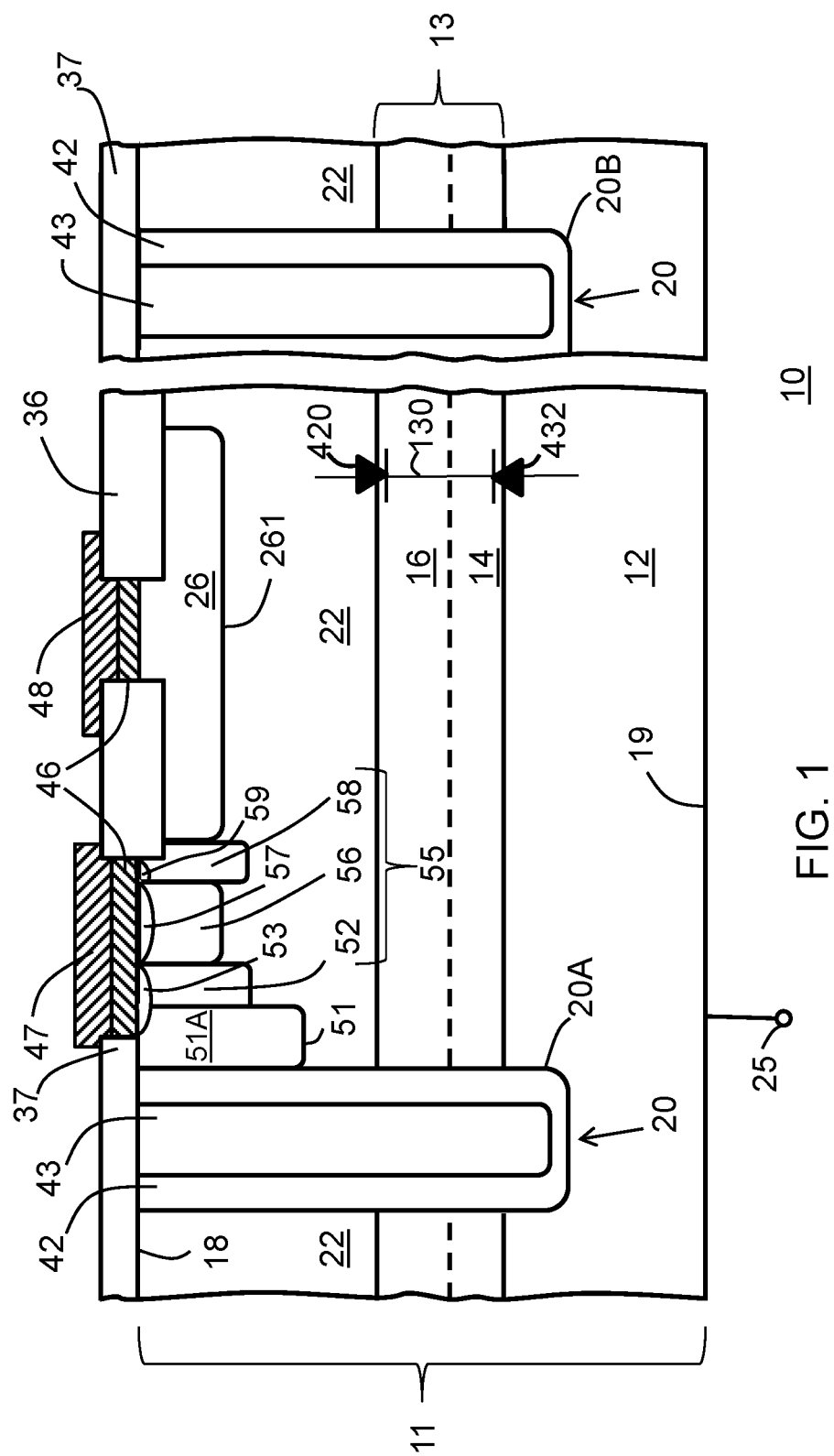
FIG. 1 illustrates an enlarged partial cross-sectional view of a semiconductor device having a floating buried doped region and embodiments of isolation structures in accordance with the present invention.

For simplicity and clarity of the illustration, elements in the figures are not necessarily drawn to scale, and the same reference numbers in different figures denote the same elements. Additionally, descriptions and details of well-known steps and elements are omitted for simplicity of the description. As used herein, current-carrying electrode means an element of a device that carries current through the device, such as a source or a drain of an MOS transistor, an emitter or a collector of a bipolar transistor, or a cathode or anode of a diode, and a control electrode means an element of the device that controls current through the device, such as a gate of a MOS transistor or a base of a bipolar transistor. Although the devices are explained herein as certain N-type regions and certain P-type regions, a person of ordinary skill in the art understands that the conductivity types can be reversed and are also possible in accordance with the present description, taking into account any necessary polarity reversal of voltages, inversion of transistor type and/or current direction, etc. For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles. Furthermore, the term major surface when used in conjunction with a semiconductor region, wafer, or substrate means the surface of the semiconductor region, wafer, or substrate that forms an interface with another material, such as a dielectric, an insulator, a conductor, or a polycrystalline semiconductor. The major surface can have a topography that changes in the x, y and z directions. As used herein, the term and/or includes any and all combinations of one or more of the associated listed items. In addition, the terminology used herein is for the purpose of describing particular embodiments only and is not intended to be limiting of the disclosure. As used herein, the singular forms are intended to include the plural forms as well, unless the context clearly indicates otherwise. It will be further understood that the terms comprises, comprising, includes, and/or including, when used in this specification, specify the presence of stated features, numbers, steps, operations, elements, and/or components, but do not preclude the presence or addition of one or more other features, numbers, steps, operations, elements, components, and/or groups thereof. It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure. It will be appreciated by those skilled in the art that words, during, while, and when as used herein related to circuit operation are not exact terms that mean an action takes place instantly upon an initiating action but that there may be some small but reasonable delay, such as propagation delay, between the reaction that is initiated by the initial action. Additionally, the term while means a certain action occurs at least within some portion of a duration of the initiating action. The use of word about, approximately or substantially means a value of an element is expected to be close to a state value or position. However, as is well known in the art there are always minor variances preventing values or positions from being exactly stated. Unless specified otherwise, as used herein the word over or on includes orientations, placements, or relations where the specified elements can be in direct or indirect physical contact. Unless specified otherwise, as used herein the word overlapping includes orientations, placements, or relations where the specified elements can at least partly or wholly coincide or align in the same or different planes. It is further understood that the embodiments illustrated and described hereinafter suitably may have embodiments and/or may be practiced in the absence of any element that is not specifically disclosed herein.

DETAILED DESCRIPTION OF THE DRAWINGS

One solution proposed for solving the above described issues with related devices uses a self-biasing floating buried structure that adjoins a trench isolation structure within a semiconductor substrate. In this approach, the self-biasing floating buried structure is provided absent any structures that provide direct ohmic or direct low-ohmic electrical contact to it. This approach is further described in co-pending U.S. patent application Ser. No. 15/140,152 filed on Apr. 27, 2016, which has common inventorship, has the same assignee, and is incorporated by reference herein in its entirety. Although this approach beneficially improves, among other things, the use of die area and improved thermal characteristics and electrical characteristics compared to prior structures and methods, in some applications it was found in practice that the potential on the floating buried layer structure could be susceptible to issues associated with parasitic currents injected into the floating buried layer from adjacent regions of the semiconductor substrate. This was found in practice to affect the stability or performance of functional devices within the semiconductor substrate. The present description provides an integrated isolation device disposed proximate a doped well portion of a functional device, which is adapted to control a vertical silicon controlled rectifier ("SCR") device between the doped well portion of the semiconductor substrate and other doped regions disposed between these elements. Another isolation device is provided to function as a barrier that reduces a leakage path between the trench isolation structure, the floating buried structure, and the doped well portions (or other device structures). These features as well as others provide a more robust semiconductor device with improved performance.

The present description includes, among other features, a semiconductor device structure comprising a self-isolating bulk semiconductor substrate. The substrate includes a floating buried doped region of a first conductivity type disposed between a first doped region of a second conductivity type and a semiconductor region of the second conductivity type. The floating buried doped region abuts or adjoins a trench isolation structure that together with the floating buried doped region electrically isolates the doped region. The trench isolation structure defines an active area of the semiconductor device structure. The bulk semiconductor substrate is provided without ohmic or low ohmic contact structures directly physically contacting the floating buried doped region. Functional devices are disposed in the first doped region. One or more isolation devices are disposed proximate to the insulated trench structure and are configured, among other things, to delay triggering of the internal SCR device described previously, and to lessen the effects of a parasitic leakage path along the insulated trench structure.

In one embodiment, a semiconductor device structure includes a self-isolating bulk semiconductor substrate having first and second opposing major surfaces. The self-isolating bulk semiconductor substrate includes a floating buried doped region of a first conductivity type; a first doped region of a second conductivity type opposite to the first conductivity type disposed between the floating buried doped region and the first major surface, wherein the first doped region abuts the floating buried doped region; and a semiconductor region of the second conductivity type disposed between the floating buried doped region and the second major surface. A trench isolation structure extends from the first major surface through the first doped region, extends through the floating buried doped region, and extends into the semiconductor region, wherein the floating buried doped region abuts the trench isolation structure. A second doped region of the first conductivity type is within the first doped region, and a first isolation device is disposed in the first doped region between the second doped region and the trench isolation structure. In one embodiment, the first isolation device comprises a first isolation first doped region of the first conductivity type; and a first isolation second doped region of the second conductivity type disposed between the second doped region and the first isolation first doped region, wherein the first isolation first doped region is electrically shorted to the first isolation second doped region. In another embodiment, the first isolation device further comprises a first isolation third doped region of the second conductivity type disposed between the first isolation first doped region and the trench isolation structure. In a further embodiment, the semiconductor device structure further comprises a second isolation device comprising a second isolation first doped region of the second conductivity type disposed between the first isolation device and the trench isolation structure.

In another embodiment, a semiconductor device structure includes a self-isolating bulk semiconductor substrate having first and second opposing major surfaces. The self-isolating bulk semiconductor substrate includes a floating buried doped region of a first conductivity type; a first doped region of a second conductivity type opposite to the first conductivity type disposed between the floating buried doped region and the first major surface, wherein the first doped region abuts the floating buried doped region; and a semiconductor region of the second conductivity type disposed between the floating buried doped region and the second major surface. A trench isolation structure extends from the first major surface through the first doped region, extends through the floating buried doped region, and extends into the semiconductor region, wherein the floating buried doped region abuts the trench isolation structure. A second doped region of the first conductivity type is within the first doped region, and a first isolation device is disposed in the first doped region between the second doped region and the trench isolation structure. In one embodiment, the first isolation device comprises a first isolation first doped region of the first conductivity type; a first isolation second doped region of the second conductivity type disposed between the second doped region and the first isolation first doped region; and a first isolation third doped region of the second conductivity type disposed between the first isolation first doped region and the trench isolation structure, wherein the first isolation first doped region is electrically shorted to the first isolation second doped region. In a further embodiment, the semiconductor device structure further comprises a second isolation device disposed between the first isolation device and the trench isolation structure, the second isolation device comprising a second isolation first doped region of the second conductivity type.

In a still further embodiment, a method of forming semiconductor device structure comprises providing a self-isolating bulk semiconductor substrate having first and second opposing major surfaces. The self-isolating bulk semiconductor substrate includes a floating buried doped region of a first conductivity type; a first doped region of a second conductivity type opposite to the first conductivity type disposed between the floating buried doped region and the first major surface, wherein the first doped region abuts the floating buried doped region; and a semiconductor region of the second conductivity type disposed between the floating buried doped region and the second major surface. The method includes providing a trench isolation structure extending from the first major surface through the first doped region, extending through the floating buried doped region, and extending into the semiconductor region, wherein the floating buried doped region abuts the trench isolation structure. The method includes providing a second doped region of the first conductivity type within the first doped region. The method includes providing a first isolation device disposed in the first doped region between the second doped region and the trench isolation structure, the first isolation device comprising a first isolation first doped region of the first conductivity type; a first isolation second doped region of the second conductivity type disposed between the second doped region and the first isolation first doped region; and a first isolation third doped region of the second conductivity type disposed between the first isolation first doped region and the trench isolation structure, wherein the first isolation first doped region is electrically shorted to the first isolation second doped region. In another embodiment, the method further comprises providing a second isolation device disposed between the first isolation device and the trench isolation structure, the second isolation device comprising a second isolation first doped region of the second conductivity type.

Turning now to the drawings, FIG. 1 illustrates an enlarged partial cross-sectional view of a device 10, an electronic device 10, a semiconductor device structure 10, or a semiconductor device 10 having a self-isolating bulk semiconductor substrate 11 or self-isolating bulk semiconductor region 11. In the present embodiment, semiconductor substrate 11 includes a first conductivity type (for example, P-type conductivity) semiconductor region 12, a second conductivity type (for example, N-type conductivity) floating buried doped region 13, a first conductivity type doped region 22, and a functional device 26. In the present embodiment, functional device 26 can be any structure and/or combination of doped regions that inject electron carriers (that is, function as an electron emitter) into doped region 22. To simplify the description, functional device 26 is illustrated in the present embodiment as a second conductivity type body structure 261. Those skilled in the art will understand that functional device 26 can include CMOS circuits, one or more high voltage transistors, one or more sensor devices, or other electronic devices. A trench isolation structure 20 (illustrated as a pair of laterally spaced apart trench isolation structure portions 20A and 20B), such as a deep trench isolation structure 20 is provided to isolate floating buried doped region 13, doped region 22, and functional device 26 from other structures provided as part of semiconductor device 10. In some embodiments, trench isolation structure 20 includes a dielectric material 42 and a conductive material 43, such as a polycrystalline semiconductor material 43.

In accordance with the present embodiment, device 10 further includes a first isolation device 55 and a second isolation device 51. As used herein, isolation devices 51 and 55 may also be referred to as isolation structures. In accordance with the present embodiment, isolation device 55 is configured to create a lateral current sink proximate to functional device 26 to divert or reduce the amount of current being directly injected into and from semiconductor region 12. Stated another way, isolation device 55 creates a path for current to flow thereby delaying a triggering of the SCR device formed, in one embodiment, between functional device 26 (which includes an N-type body structure 261 and/or any other N-type well, region or structure within doped region 22), P-type doped region 22, N-type floating buried doped region 13, and P-type semiconductor region 12. In one embodiment, as will be described in more detail later, isolation device 55 includes an N-type doped region 56, a P-type doped region 52, and another P-type doped region 58 disposed proximate to peripheral edge regions of doped region 22 between N-type body structure 261 and trench isolation structure portions 20A and 20B.

Although FIG. 1 illustrates isolation structures 51 and 55 adjacent trench isolation structure portion 20A, such isolation structures also are preferably placed adjacent trench isolation structure portion 20B. In some embodiments, trench isolation structure 20 and isolation structures 51 and 55 are provided within one or more doped regions 22 of semiconductor device 10 as ring-like structures encircling or enclosing the functional devices 26 disposed within the doped regions 22. It is further understood that one or more of isolation structures 51 and 55 can be included in other doped regions 22 of semiconductor device 10.

In the past, when polycrystalline semiconductor material 43 in trench isolation structure 20 became coupled, for example, to a surrounding potential, it could function as a MOS gate and undesirably create a leakage path within doped region 22 proximate to sidewalls of trench isolation structure 20. For example, this MOS gate effect could create a leakage path between floating buried doped region 13 and, for example, one or more functional devices 26 within doped region 22. This leakage path could also connect between floating buried doped region 13 and other the surface regions of doped region 22. In accordance with the present embodiment, isolation device 51 is configured to create a barrier to reduce the effects of these leakage paths. In one embodiment, isolation device 51 includes a P-type doped region 51A having a higher dopant concentration than P-type doped region 22. Stated a different way, P-type doped region 51A is provided to increase the threshold voltage of the MOS gate structure of trench isolation structure 20. Further details of P-type doped region 51A will be described later.

Figure 2:
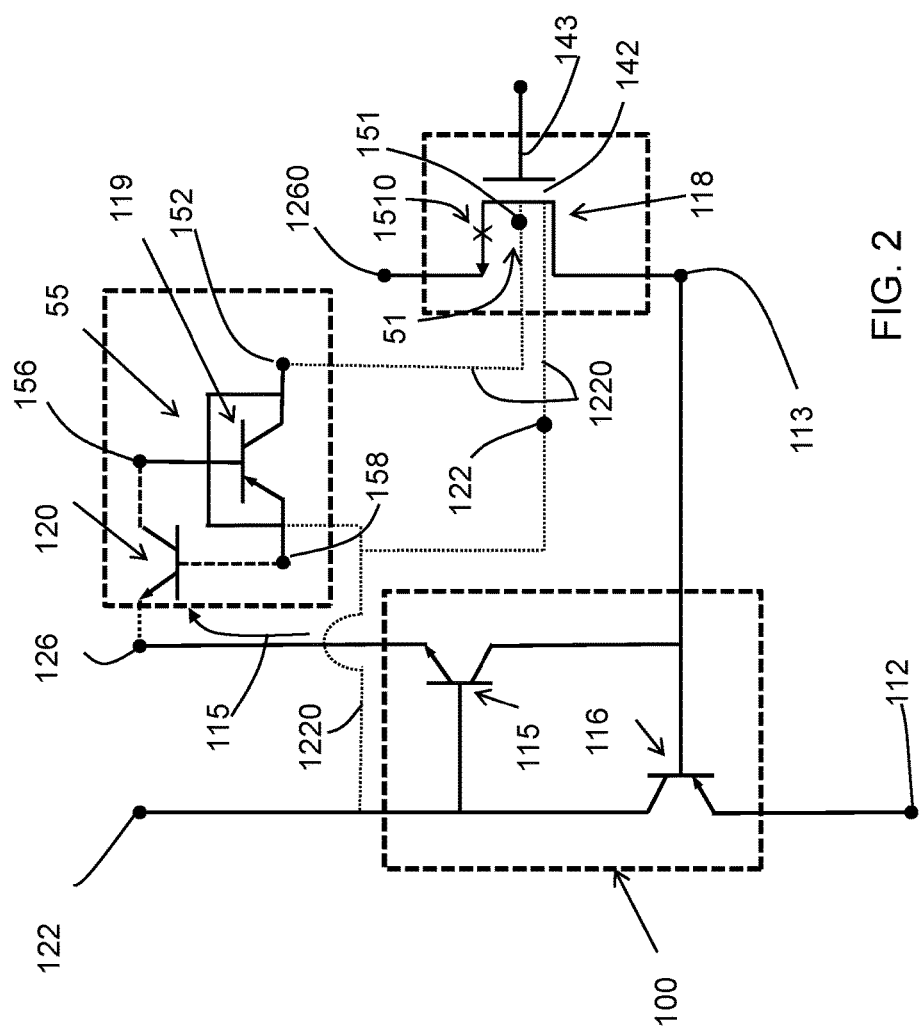
FIG. 2 is a circuit schematic of the isolation structures in relation to various structures of the semiconductor device of FIG. 1.

FIG. 2 is a circuit schematic of semiconductor device 10 including isolation devices 51 and 55 in accordance with the present embodiment. In the present embodiment, isolation device 55 is configured as a PNP transistor 119, and isolation device 51 is configured within a channel region of MOSFET device 118 as P-type element 151. In accordance with present embodiment, a P-type element 158 forms the emitter of PNP transistor 119 and the base of a NPN transistor 120; an N-type element 156 forms the base of PNP transistor 119 and the collector of NPN transistor 120; and a P-type element 152 forms the collector of PNP transistor 120. In accordance with the present embodiment, P-type element 158 corresponds to P-type doped region 58, N-type element 156 corresponds to N-type doped region 56, and P-type element 159 corresponds to P-type doped region 159 of isolation device 55. In FIG. 2, elements 152, 156, and 158 are shown electrically shorted together in PNP transistor 119. It is understood that other shorting schemes are possible as well as will be described in more detail later.

SCR device 100 includes a P-type element 122, which forms the base of NPN transistor 115 and the collector of PNP transistor 116. In the present embodiment, P-type element 122 corresponds to P-type doped region 22 of semiconductor device 10. SCR device 100 further includes an N-type element 126, which forms the emitter of NPN transistor 115 and the emitter of NPN transistor 120, which is in electrical communication with PNP transistor 119. In the present embodiment, N-type element 126 corresponds to N-type body structure 261 of semiconductor device, but it is understood that element 126 can be any structure within doped region 22 of semiconductor device 10 that can function as an emitter.

The SCR device described previously is shown as SCR device 100 and includes an N-type element 113, which forms the collector of NPN transistor 115 and the base of PNP transistor 116. In the present embodiment, N-type element 113 corresponds to N-type floating buried doped region 13 of semiconductor device 10. P-type element 112 forms the emitter of PNP transistor 116 and corresponds to P-type semiconductor region 12 of semiconductor device 10. In accordance with the present embodiment, PNP transistor 119 is an electrically shorted device and functions to divert current (represented by arrow 115) away from SCR device 100 thereby diverting it away from direct injection into semiconductor region 12 of semiconductor device 10. By doing so, and in accordance with the present embodiment, this changes the potential of P-type doped region 22 and delays the triggering of SCR device 100.

In the present embodiment, N-type element 113 further corresponds to a current-carrying electrode of MOSFET device 118. In addition, element 142 forms the gate dielectric region of MOSFET device 118, which corresponds to dielectric material 42 of trench isolation structure 20; element 143 forms the gate electrode of MOSFET device 118, which corresponds to conductive material 43 of trench isolation structure 20; and element 1260 forms another current-carrying electrode of MOSFET device 118. In the present embodiment, element 1260 can be N-type body structure 261, or any other N-type region within P-type doped region 22 of semiconductor device 10. Stippled lines 1220 represents a distributed connection that is present within doped region 22 of semiconductor device 10 because P-type doped region 22 is in soft or resistive electrical communication through P-type element 122 with P-type element 158, P-type element 152, and P-type element 151, which would be a common node if P-type doped region 22 was a completely conductive region as opposed to a lightly doped semiconductive region.

In MOSFET device 118, P-type element 122 can invert easily to provide a channel region between N-type element 113 and element 1260. In accordance with the present embodiment, P-type element 151 (i.e., doped region 51A of semiconductor device 10) is placed proximate to the channel region and has a higher dopant concentration than P-type element 122. This raises the threshold voltage of MOSFET device 118 thereby delaying the formation of the channel region thereby reducing leakage current (represented by "X" element 1510 in FIG. 2) between N-type element 113 and element 1260.

With reference now back to semiconductor substrate 11 and FIG. 1, in one embodiment semiconductor substrate 11 is configured to have improved thermal conductivity compared SOI substrates, and improved device density and performance compared to bulk substrates that use lateral junction isolation structures and/or doped sinker structures. In one embodiment, semiconductor device 10 is configured as a smart power semiconductor device including analog, digital, and power functionality integrated as functional devices 26 within (e.g., including on and in) semiconductor substrate 11. In the present embodiment, semiconductor substrate 11, which includes a major surface 18 and an opposing major surface 19, includes P-type semiconductor region 12 or PSUB wafer 12. In one embodiment, semiconductor region 12 is a silicon region or wafer doped with boron, and has a dopant concentration in a range from about $4.0 \times 10^{18}$ atoms/cm$^3$ to about $1.0 \times 10^{19}$ atoms/cm$^3$ or more. It is understood that semiconductor region 12 can comprise a plurality of P-type layers of different dopant concentration. Additionally, it is understood that semiconductor region 12 can include other types of materials including, but not limited to, heterojunction semiconductor materials. In accordance with the present embodiment, semiconductor region 12 is configured to be connected to a potential (denoted generally by node 25) or configured to be a floating region (i.e., no ohmic or low-ohmic external voltage is imposed on semiconductor region 12 through node 25).

Semiconductor substrate 11 further includes doped region 22, which can also be referred to as doped layer 22, or doped pockets 22, and is disposed adjacent to major surface 18. In one embodiment, doped region 22 can be a P-type conductivity region or layer and can be formed using epitaxial growth techniques, ion implantation and diffusion techniques, or other methods as known to those skilled in the art.

In some embodiments, doped region 22 has a dopant concentration in a range from about $1.0 \times 10^{15}$ atoms/cm$^3$ to about $1.0 \times 10^{16}$ atoms/cm$^3$. In one embodiment, doped region 22 has a dopant concentration of about $3.0 \times 10^{15}$ atoms/cm$^3$. It is understood that the dopant concentration of doped region 22 as well as its thickness is adjusted in accordance with the desired characteristics of the functional devices 26 formed within semiconductor substrate 11. In another embodiment, doped region 22 can have a graded dopant profile. In a further embodiment, doped region 22 comprises a plurality of P-type layers of different dopant concentrations. In a still further embodiment, doped region 22 has a substantially uniform dopant concentration in a direction substantially perpendicular to major surface 18.

Semiconductor substrate 11 further includes floating buried doped region 13, which can also be referred to as sub-surface doped region 13, floating buried doped layer 13, or separation layer 13, and is disposed between semiconductor region 12 and doped region 22. In one embodiment, floating buried doped region 13 is configured to include an N-type layer 14 or buried doped region 14 and an N-type buried layer 16 or buried region 16. In some embodiments, buried doped region 14 and buried layer 16 can be formed using ion implantation, diffusion, and/or epitaxial growth techniques. In another embodiment, floating buried doped layer 13 includes only buried region 16. Another embodiment of floating buried doped region 13 is described later in conjunction with FIG. 9.

In the present embodiment, floating buried doped region 13 is an electrically floating region, which means that no ohmic or low-ohmic external voltage is imposed on floating buried doped region 13. More particularly, semiconductor substrate 11 and semiconductor device 10 are configured without any conductive or doped semiconductor structures providing an ohmic or highly doped contact or direct electrical pathway to buried doped region 13. Stated another way, doped region 22 and semiconductor region 12 are formed or provided absent any diffused contact structures or conductive contact structures making direct or low-ohmic contact to floating buried doped region 13. Stated a different way, doped region 22 and semiconductor region 12 are configured so that no low-ohmic external voltage is imposed on floating buried doped region 13. In a preferred embodiment, floating buried doped region 13 extends laterally all the way or entirely across semiconductor region 12 between adjacent trench isolation structure portions 20A and 20B as illustrated in FIG. 1. More particularly, floating buried doped region 13 abuts or adjoins a pair of spaced apart trench isolation structure portions 20A and 20B in cross-sectional view. Stated another way, floating buried doped region 13 completely vertically separates doped region 22 from semiconductor region 12 with no portion of doped region 22 directly contacting semiconductor region 12 between trench isolation structure portions 20A and 20B. In one preferred embodiment, floating buried doped region 13 functions together with trench isolation structure portions 20A and 20B to provide one or more electrically isolated doped regions 22 for semiconductor device 10. Specifically, the present embodiment uses a back-to-back (i.e., anti-series) diode configuration 130 (comprising diodes 420 and 432) between P-type doped region 22, N-type floating buried doped region 13, and P-type semiconductor region 12 as part of a preferred isolation scheme, structure, or configuration for semiconductor device 10.

In the present embodiment, semiconductor substrate 11 and device 10 are configured without doped sinker regions extending from major surface 18 to N-type floating buried doped region 13 where the doped sinker regions and N-type floating buried doped region 13 have the same conductivity type and directly contact each other. Further, semiconductor substrate 11 and device 10 are provided absent or without any laterally extending buried oxides or SOI structures that partially or completely vertically separate doped regions 22 from semiconductor region 12. Previously, it was believed that in order to have P-type doped regions 22 on top of a P-type semiconductor region 12 it was required to either provide N-type sinkers extending from major surface 18 to the buried layer to provide necessary isolation for the functional devices within doped region 22 and/or to define the potential of the buried layer; or to use a buried oxide isolation or SOI isolation scheme between doped regions 22 and semiconductor region 12. However, it was found in practice that this is not the case and that the potential of N-type floating buried doped region 13 can electrically configure itself in accordance with the present embodiments so as to form an electrical barrier between doped region 22 and semiconductor region 12.

In accordance with the present embodiment, self-isolating bulk semiconductor substrate 11 advantageously provides a bulk substrate configuration that has the compactness or circuit density of SOI substrates compared to substrates using diffused sinker structures, has improved thermal performance compared to SOI substrates, enables reduced coupling between doped regions 22 and semiconductor region 12, and has a significantly lower substrate cost compared to SOI substrates—at least 30% lower in comparative base substrate cost. Also, functional devices 26 disposed within doped regions 22 can freely float positive and negative versus the potential of semiconductor region 12. Additionally, the self-biasing aspect of floating buried doped region 13 enables the PNP vertical transistor (or back-to-back diode 130) to function as if semiconductor substrate 11 is an SOI-like substrate without the associated disadvantages of SOI. In addition, because semiconductor substrate 11 and semiconductor device 10 are provided without diffused sinker regions or other direct contact structures, the lateral distance between trench isolation structure portions 20A and 20B can be reduced to provide active area gains (similar to SOI substrates), which reduces costs significantly. Further, semiconductor substrate 11 comprises a semiconductor material and therefore does not have the thermal disadvantages associated with SOI substrates (i.e., thermal resistances reduced or substantially eliminated). Moreover, semiconductor substrate 11 is manufactured using available epitaxial growth, ion implantation, and/or diffusion techniques, which provides for cost effective manufacturing.

As set forth previously, device 10 further includes trench isolation structure 20, which can include isolation structure portions 20A and 20B, dielectric isolation structures 20A and 20B, deep trench isolation structures 20A and 20B, or trench isolation regions 20A and 20B extending from major surface 18 downward or substantially vertically into semiconductor region 12 of semiconductor substrate 11. In accordance with the present embodiment, trench isolation structure portions 20A and 20B are configured to laterally isolate, both physically and electrically, adjacent device doped regions 22 within semiconductor substrate 11 where functional devices 26 are provided. Stated another way, trench isolation structure portions 20A and 20B are configured to laterally isolate, both physically and electrically, doped region 22 of a given pocket from any adjacent doped regions 22 belonging to one or more adjacent pockets, and to isolate floating buried doped region 13 of a given pocket from any adjacent floating buried doped regions 13 belonging to adjacent pockets. In one embodiment, trench isolation structure portions 20A and 20B are part of an interconnected and continuous trench isolation structure 20. In another embodiment, trench isolation structure portions 20A and 20B can be individual isolation structures that completely surround a given doped region 22 or pocket.

In one embodiment, trench isolation structure portions 20A and 20B can be deep trench structures formed using deep reactive ion etching (DRIE) techniques. In most embodiments, the etched trenches are filled or lined with a combination of a dielectric liner 42 or dielectric material 42, and conductive material 43, such as polycrystalline semiconductor material 43. In another embodiment, trench isolation structure portions 20A and 20B can be filled or at least lined using one or more dielectric materials 42 only.

Functional devices 26 can include, for example, power metal-oxide semiconductor ("MOS") devices, such as LDMOS devices, diode devices, complementary MOS ("CMOS") and/or bipolar logic devices, CMOS and/or bipolar analog devices, sensor devices, bipolar power transistor devices, insulated gate bipolar transistor ("IGBT") power devices, thyristors power devices, other power devices, and other similar semiconductor devices as known to those skilled in the art. It is understood that multiple functional devices 26, may be instantiated inside doped region 22 delineated by trench isolation structure portions 20A and 20B. Stated another way, a given doped region 22 delineated by trench isolation structure portions 20A and 20B may include multiple functional devices 26, as is common practice in smart power technologies. Also, it is understood that functional device 26 has been illustrated in simplified form so as to not distract from the present disclosure. Those skilled in the art understand that functional device 26 can include additional doped regions, isolation regions, and contact regions or structures. In accordance with the present embodiment, at least some portion of functional device 26 is configured for injecting electron carriers into doped region 22 thereby facilitating a need for one or more of the isolation devices 51 and 55 described in more detail next. In one embodiment, functional device 26 comprises at least an N-type body structure 261 or N-type doped region 261 having a depth from major surface 18 into semiconductor substrate 11 in a range from about 0.5 microns to about 3.5 microns and a dopant concentration in a range from about $1.0 \times 10^{16}$ atoms/cm$^3$ through about $1.0 \times 10^{18}$ atoms/cm$^3$.

As set forth previously, semiconductor device 10 further includes one or more isolation structures, such as isolation structure 51 and isolation structure 55. In accordance with the present embodiment, isolation structure 51 comprises a doped region 51A having the same conductivity type as doped region 22, but having a higher dopant concentration than doped region 22. In one embodiment, doped region 51A has a P-type conductivity, a depth from major surface 18 into semiconductor substrate 11 in a range from about 1.5 microns through about 3 microns, a width in a range from about 1.2 microns to about 3.0 microns, and a dopant concentration in a range from about $1.0 \times 10^{16}$ atoms/cm$^3$ through about $1.0 \times 10^{18}$ atoms/cm$^3$. In one preferred embodiment, doped region 51A has a depth of about 2.5 microns, a width of about 1.7 microns, and a peak dopant concentration of about $1.0 \times 10^{17}$ atoms/cm$^3$. In some embodiments, doped region 51A is formed using one or more ion implant doses and one or more ion implant energies. In most embodiments, doped region 51A is provided as a ring-like structure from a top plan view that completely surrounds doped region 22. Stated a different way, doped region 51A can be provided so that it is proximate to a sidewall of trench isolation structure 20 and follows the pattern used for trench isolation structure 20 in the top plan view.

In accordance with the present embodiment, isolation device 51 is configured to reduce the effects of trench isolation structure 20 acting as a MOS gate structure, which in the past has created leakage paths between floating buried doped region 13 and, for example, functional device 26. Also, the MOS gate effect may cause a channel to form or turn on along trench isolation structure 20, which can electrically connect the surface of doped region 22 with floating buried doped region 13. In addition, the MOS gate effect may cause a channel to form or turn on along trench isolation structure 20, which can bring the voltage of floating buried doped region 13 and semiconductor region 12 to the surface of doped region 22. These noted effects alone or in combination impact the performance of previous semiconductor devices, and isolation structure 51 is configured to reduce these effects as well as others thereby improving the performance of semiconductor device 10. In one embodiment, isolation structure 51 abuts trench isolation structure 20 as generally illustrated in FIG. 1. In an alternative embodiment, which will be described in conjunction with FIG. 6, isolation structure 51 can be laterally spaced apart from trench isolation structure 20.

In one embodiment, an enhancement region, such as a surface enhancement region 53 is provided in at least a portion of doped region 51A proximate to major surface 18 to increase the surface dopant concentration of doped region 51A when a conductive contact 46 makes contact to a portion of doped region 51A. In one embodiment, conductive contact 46 is a self-aligned silicide or "salicide" structure. Conductive contact 46 can be any silicide, such as titanium, nickel, cobalt, molybdenum, tantalum or other conductive materials as known to those skilled in the art. In one preferred embodiment, conductive contact 46 does not laterally extend to completely overlap doped region 51A so that a lateral space or separation exists between the edge of trench isolation structure portion 20A and the edge of conductive contact 46 as generally illustrated in FIG. 1. In other embodiments, which will be described later, conductive contact 46 does not make direct physical contact to doped region 51A. In some embodiments, conductive contact 46 also makes contact one or more doped regions provided as part of functional device 26.

It has been observed experimentally that by adding isolation structure 51 to semiconductor device 10, semiconductor device 10 has a greater than 100 volt tolerance before unacceptable leakage levels occur compared to about a 90 volt tolerance for a semiconductor device without isolation structure 51.

In accordance with the present embodiment, isolation structure 55 includes a doped region 56 having the same conductivity type as floating buried doped region 13. In one embodiment, doped region 56 has N-type conductivity, a depth from major surface into semiconductor substrate 11 in a range from about 0.4 microns to about 1.0 microns, a width in a range from about 0.8 microns to about 1.4 microns, and a dopant concentration in a range from about $1.0 \times 10^{16}$ atoms/cm$^3$ through about $1.0 \times 10^{18}$ atoms/cm$^3$. In one preferred embodiment, doped region 56 has a depth of about 0.6 microns, a width of about 1.2 microns, and a peak dopant concentration of about $1.0 \times 10^{17}$ atoms/cm$^3$. In some embodiments, doped region 56 is formed using one or more ion implant doses and one or more ion implant energies. In most embodiments, doped region 56 is provided as a ring-like structure from a top plan view that completely surrounds doped region 22. Stated a different way, doped region 56 can be provided so that it generally follows the pattern used for trench isolation structure 20 in the top plan view. In accordance with the present embodiment, doped region 56 is interposed between N-type body structure 261 and trench isolation structure 20, and is laterally spaced apart from N-type body structure 261.

Isolation structure 55 further includes a doped region 58 having the same conductivity type as doped region 22, but having a higher dopant concentration than doped region 22. In one embodiment, doped region 58 has P-type conductivity, a depth from major surface 18 into semiconductor substrate 11 in a range from about 0.6 microns to about 1.0 microns, a width in a range from about 0.8 microns to about 2.0 microns, and a dopant concentration in a range from about $1.0 \times 10^{16}$ atoms/cm$^3$ through about $1.0 \times 10^{18}$ atoms/cm$^3$. In one preferred embodiment, doped region 58 has a depth of about 0.8 microns, a width of about 1.7 microns, and a peak dopant concentration of about $1.0 \times 10^{17}$ atoms/cm$^3$. In some embodiments, doped region 58 is formed using one or more ion implant doses and one or more ion implant energies. In most embodiments, doped region 58 is provided as a ring-like structure from a top plan view that completely surrounds functional device 26. Stated a different way, doped region 58 can be provided so that it generally follows the pattern used for trench isolation structure 20 in the top plan view. In accordance with the present embodiment, doped region 58 is interposed between N-type body structure 261 and doped region 56. In one embodiment, doped region 58 can abut N-type body structure 261. In other embodiments, doped region 58 can be laterally spaced apart from N-type body structure 261.

In accordance with the present embodiment, doped region 56 and doped region 58 are electrically connected or shorted together by, for example, conductive contact 46 or by other structures as known to those skilled in the art. In some embodiments, a surface enhancement region 57 is provided in at least a portion of doped region 56 proximate to major surface 18 to increase the dopant concentration of doped region 56 and reduce contact resistance with conductive contact 46. Similarly, a surface enhancement region 59 can be provided in at least a portion of doped region 58 to achieve the same effect.

In some embodiments, isolation structure 55 further includes a doped region 52 having the same conductivity type as doped region 22, but having a higher dopant concentration than doped region 22. In one embodiment, doped region 52 has P-type conductivity and is provided with depth, width, and dopant concentration ranges similar to the ranges described for doped region 58; however, it is understood that doped regions 52 and 58 can have different dopant profiles, depths, and/or widths facilitating design flexibility that improves electrical performance of semiconductor device 10. For example, in one preferred embodiment, doped region 58 is provided with a lower dopant concentration than doped region 52 to improve the current collection capability of doped region 58 injected into P-type region 22 from N-type body structure 261. Also, doped region 52 can be provided with a higher dopant concentration than doped region 58 and can provided to have a greater depth into P-type doped region 22 to further improve the isolation from trench isolation structure 20 and its associated MOS-gate/channel formation effects.

In accordance with the present embodiment, doped region 52 is interposed between doped region 56 and trench isolation structure 20, and is laterally spaced apart from N-type body structure 261. In one embodiment, doped region 52 abuts doped region 56 on one side in cross-sectional view and adjoins doped region 51A on an opposite side in the cross-sectional view. In other embodiments, which will be described later, doped region 52 can laterally overlap doped region 51A. In one embodiment, surface enhancement region 53 is further provided in at least a portion of the doped region 52 to increase the surface concentration of doped region 52 and reduce contact resistance with conductive contact 46 when conductive contact 46 physically contacts doped region 52. In other embodiments, conductive contact 46 does not extend to overlap and directly contact doped region 52.

In some embodiments, doped region 52 is formed using one or more ion implant doses and one or more ion implant energies. In most embodiments, doped region 52 is provided as a ring-like structure from a top plan view that completely surrounds functional device 26. Stated a different way, doped region 52 can be provided so that it generally follows the pattern used for trench isolation structure 20 in the top plan view.

Doped regions 52 and 58 can be formed in a single masking step or different masking steps, and doped regions 51A and 56 can be formed in separate masking steps. In some preferred embodiments, the masking steps used to form the doped regions for isolation structures 51 and 55 are also used to form other regions of semiconductor device 10 to avoid adding masking layers unique to the isolation structures of the present embodiment. In one embodiment, conductive contact 46 is configured to electrically short at least doped region 56 and doped region 58 together. In some embodiments, conductive contact 46 also electrically shorts doped region 52, doped region 56, and doped region 58 together as generally illustrated in FIG. 1. In accordance with the present embodiment, doped region 52 is preferred in some embodiments to laterally separate doped region 51A from doped region 56 to thereby maximize the lateral beta for NPN transistor 120 (illustrated in FIG. 2) formed between N-type body structure 261, P-type doped region 58, and N-type doped region 56. In some embodiments, if P-type doped region 51A is placed too close to N-type doped region 56, the base charged added by doped region 51A can detrimentally impact Beta of the lateral NPN transistor 120.

It has been observed experimentally that by adding isolation structure 55 to semiconductor device 10, the trigger voltage for SCR device 100 is about 60 volts compared to about 2 volts for a semiconductor device without isolation structure 55. In addition, it has been observed experimentally that the trigger current for SCR device 100 is about 100 micro-Amps for semiconductor device 10 with isolation structure 55 compared to about 1 nano-Amp for a semiconductor device without isolation structure 55. In accordance with the present embodiment, isolation device 55 is configured to provide a collector of electron carriers within the doped region 22 thereby reducing trigger voltage and trigger current of SCR device 100.

In one embodiment, device 10 further includes field dielectric regions 36 disposed on, atop, partially within, or overlying major surface 18. In one embodiment, field dielectric regions 36 can be an oxide material formed using thermal oxidation processes, low-temperature deposition processes, or other techniques as known to those skilled in the art. By way of example, field dielectric regions 36 can be shallow trench dielectric regions or LOCOS dielectric regions.

Device 10 further includes dielectric regions 37 disposed over major surface 18. In some embodiments, dielectric regions 37 are inter-layer dielectric ("ILD") regions comprising deposited dielectrics, such as one or more deposited oxides. Dielectric regions 37 or portions thereof can be doped dielectrics, such as phosphosilicate glass ("PSG") dielectrics and/or borophosphosilicate glass ("BPSG") dielectrics. It is understood that other isolation structures may be used instead or in addition to dielectric regions 37 and field dielectric regions 36.

In some embodiments, device 10 further includes conductive electrodes 47 and 48 electrically connected to isolation device 51 and 55 and functional device 26 respectively. Conductive electrodes 47 and 48 can comprise a conductive material, such as one or more metals including for example, aluminum, aluminum alloys, titanium, titanium nitride, tungsten, copper, combinations thereof, or other conductive materials as known to those skilled in the art. Additional conductive interconnect structures and ILD structures can be incorporated to provide input/output signals to device 10 and to interconnect the various functional devices within device 10. In other embodiments, such as the embodiments described in FIGS. 3 and 5-8 do not include conductive electrode 47 and conductive contact 46 can be insulated using, for example, another dielectric region.

In accordance with the present embodiment floating buried doped region 13 is configured as a self-biased region because there is no direct external electrical potential applied to it. It was found in practice that any potential received by floating buried doped region 13 results from adjoining junctions within doped region 22 and semiconductor region 12, or from biasing devices further integrated within doped region 22. Such biasing devices are further described in U.S. patent application Ser. No. 15/497,443, filed on Apr. 26, 2017, which has common inventorship, has the same assignee, and is incorporated by reference herein in its entirety.

Figure 3:
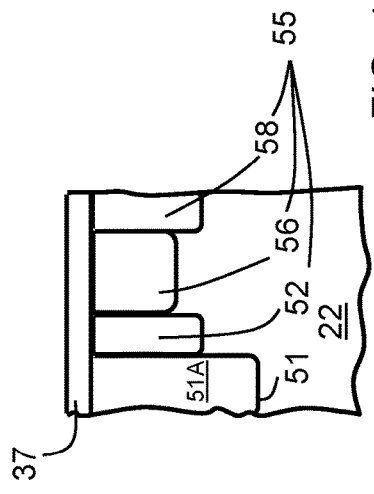
FIG. 3 illustrates an enlarged partial cross-sectional view of another embodiment of an isolation structure in accordance with the present invention.

FIG. 3 illustrates an enlarged partial cross-sectional view of a semiconductor device 300 having isolation structures 51 and 55 in accordance with another embodiment. Semiconductor device 300 is similar to semiconductor device 10 and only the key differences will be described hereinafter. In semiconductor device 300, conductive contact 46 overlaps at least in part doped region 56 and doped region 58, but does not overlap and directly contact either doped region 52 or doped region 51A. In this embodiment, conductive contact 46 electrically shorts doped region 56 and doped region 58 together, and doped region 51A and doped region 52 can be electrically floating without direct external electrical contact.

Figure 4:
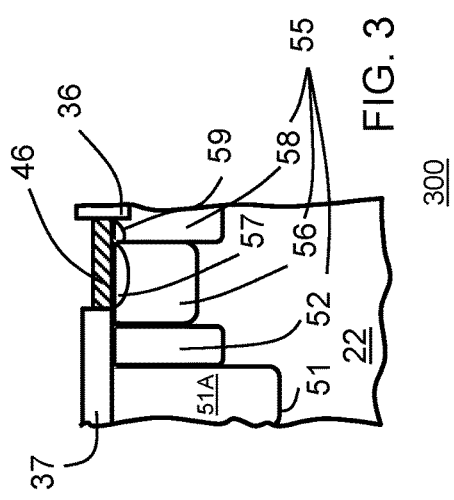
FIG. 4 illustrates an enlarged partial cross-sectional view of a further embodiment of an isolation structure in accordance with the present invention.

FIG. 4 illustrates an enlarged partial cross-sectional view of a semiconductor device 400 having isolation structures 51 and 55 in accordance with a further embodiment. Semiconductor device 400 is similar to semiconductor device 10 and only the key differences will be described hereinafter. In this embodiment, conductive contact 46 is not used, and the lateral PNP transistor formed by doped region 52, doped region 56, and doped region 58 is left floating without external electrical contact. In addition, doped region 51A can be electrically floating without external electrical contact.

Figure 5:
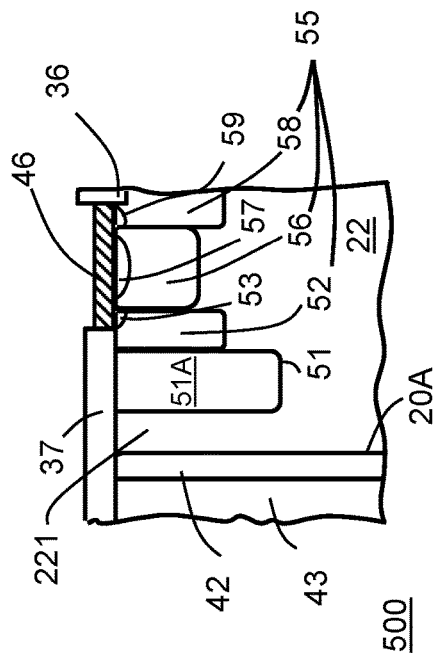
FIG. 5 illustrates an enlarged partial cross-sectional view of another embodiment of an isolation structure in accordance with the present invention.

FIG. 5 illustrates an enlarged partial cross-sectional view of a semiconductor device 500 having isolation structures 51 and 55 in accordance with another embodiment. Semiconductor device 500 is similar to semiconductor device 10 and only the key differences will be described hereinafter. In this embodiment, doped region 51A is laterally spaced apart from trench isolation structure portion 20A such that a portion 221 of doped region 22 extends to major surface 18 between trench isolation structure portion 20A and doped region 51A. In addition, doped region 51A can be electrically floating without external electrical contact.

FIG. 6 illustrates an enlarged partial cross-sectional view of a semiconductor device 600 having isolation structures 51 and 55 in accordance with another embodiment. Semiconductor device 600 is similar to semiconductor device 10 and only the key differences will be described hereinafter. In this embodiment, doped region 52 laterally extends to partially overlap doped region 51A.

FIG. 7 illustrates an enlarged partial cross-sectional view of a semiconductor device 700 having isolation structures 51 and 55 in accordance with a further embodiment. Semiconductor device 700 is similar to semiconductor device 10 and only the key differences will be described hereinafter. In this embodiment, doped region 52 is not used and doped region 56 can laterally extend to abut doped region 51A. In addition, doped region 51A is illustrated having a plurality of doped regions 510A, 510B, 510C, and 510D, which can be formed using multiple ion implant doses and/or ion implant energies. In addition, doped region 51A can be electrically floating without external contact.

Figure 8:
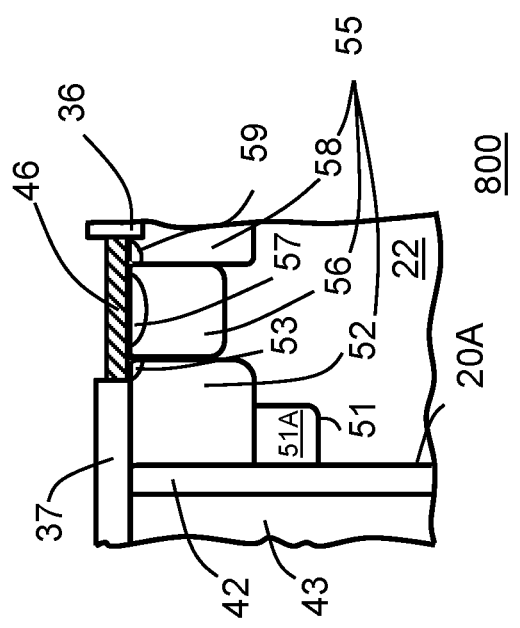
FIG. 8 illustrates an enlarged partial cross-sectional view of a further embodiment of an isolation structure in accordance with the present invention.

FIG. 8 illustrates an enlarged partial cross-sectional view of a semiconductor device 800 having isolation structures 51 and 55 in accordance with another embodiment. Semiconductor device 800 is similar to semiconductor device 10 and only the key differences will be described hereinafter. In this embodiment, doped region 52 is disposed to laterally extend and overlap all of doped region 51A such that doped region 52 is adjacent to trench isolation structure portion 20A.

Those skilled in the art will understand that the various embodiments of isolation devices 51 and 55 illustrated in FIGS. 1 and 3-8 can be combined in various combinations within a particular semiconductor device 10. For example, a semiconductor device 10 may include one or more of the different embodiments illustrated within different doped regions 22 or even within the same doped region 22. In addition doped regions 51A, 52, 56, and 58 can be electrically shorted together in any of the embodiments illustrated where one or more of the doped regions left electrically floating.

Figure 9:
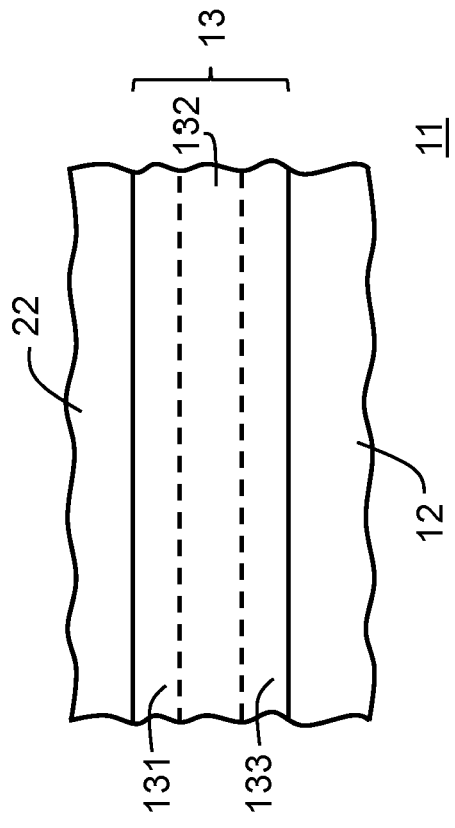
FIG. 9 illustrates an enlarged partial cross-sectional view of a semiconductor substrate having a floating buried doped region in accordance with an alternative embodiment of the present invention.

FIG. 9 illustrates a partial cross-sectional view of a portion of semiconductor substrate 11 in accordance with one preferred embodiment, which can be used with any of the embodiments described in FIGS. 1 and 3-8. In this embodiment, N-type floating buried doped region 13 has a varying dopant profile or varying dopant concentration designated for example, as regions or portions 131, 132, and 133. Since floating buried doped region 13 does not have to make a low-ohmic contact to a contact structure (e.g., a diffused contact or trench contact), it is not important for region 131 (i.e., the region that adjoins doped region 22) of floating buried doped region 13 to be of a high dopant concentration (e.g., does not have to doped greater than $1.0 \times 10^{19}$ atoms/cm$^3$). This allows for region 131 of floating buried doped region 13 to have a lower dopant concentration, which beneficially facilitates the optimization of junction breakdown (e.g., provides lower electric field in region 131 of floating buried doped region 13) or depletion region reach-through (e.g., provides lower penetration of space charge regions within doped region 22) characteristics of the functional devices and bias devices integrated within doped region 22. In a further preferred embodiment, region 132 of floating buried doped region 13 has a higher dopant concentration than region 131, which beneficially facilitates the control of parasitics within device 10. For example region 132 facilitates the elimination of or reduces the effects of the base region of a parasitic vertical PNP transistor formed by P-type doped region 22, N-type floating buried doped region 13, and P-type semiconductor region 12. In one embodiment, region 133 of floating buried doped region 13 has a lower dopant concentration than region 132 and a lower dopant concentration than region 131. It is understood that the thicknesses of each of the regions 131-133 can be different or the same depending on the performance requirements of device 10.

By way of example, region 131 has a dopant concentration in a range from about $1.0 \times 10^{15}$ atoms/cm$^3$ to about $1.0 \times 10^{17}$ atoms/cm$^3$ and a thickness in a range from 3 microns through about 5 microns; region 132 has a dopant concentration in a range from about $1.0 \times 10^{17}$ atoms/cm$^3$ to about $1.0 \times 10^{19}$ atoms/cm$^3$, and a thickness in a range from about 1 micron through about 3 microns; and region 133 has a dopant concentration in a range from about $1.0 \times 10^{15}$ atoms/cm$^3$ to about $1.0 \times 10^{17}$ atoms/cm$^3$, and thickness in a range from about 3 microns through about 5 microns. In another embodiment, floating buried doped region 13 has graded dopant profile. In a further embodiment, floating buried doped region 13 has a substantially constant dopant concentration. Floating buried doped region 13 can be doped with one or more of phosphorous, arsenic, or antimony. In one embodiment of floating buried doped region 13 using doped region 14 and buried layer 16, doped region 14 has a thickness/depth in a range from about 12 microns to about 18 microns, and buried layer 16 has a thickness/depth in a range from about 3 microns to about 5 microns.

In some embodiments, floating buried doped region 13 has an as-formed dopant profile formed using epitaxial growth techniques. In other embodiments, floating buried doped region 13 and doped region 22 can be formed together using epitaxial growth techniques. In some embodiments, floating buried doped region 13 can be formed using ion implantation and diffusion techniques or other techniques as known to those skilled in the art. In one embodiment, a portion of floating buried doped region 13 is formed using epitaxial growth techniques and another portion of floating buried doped region 13 can be formed using ion implantation techniques. The implanted dopant can be diffused separately or during the epitaxial growth process for forming doped region 22.

In summary, the self-isolating bulk semiconductor substrate 11 has several advantages over prior substrates used in semiconductor technologies, such as smart power technologies. For example, semiconductor substrate 11 has more compact P-type doped regions 22 compared to previous bulk substrates using diffused sinker or other contact structure processes. This provides for advantageous device area gains. Also, the functional device 26 disposed within P-type doped regions 22 can freely float positive and negative versus semiconductor region 12. More particularly, the self-biasing characteristics of N-type floating buried doped region 13 functions so that the P-type doped region 22/N-type floating buried doped region 13/semiconductor region 12 vertical stack behaves similar to an SOI substrate within the constraints of the junction breakdown limits. Additionally, semiconductor substrate 11 has lower costs compared to previous bulk substrates by eliminating the sinker technology and SOI technology. In addition, semiconductor substrate 11 eliminates an inherent high gain lateral parasitic bipolar transistor present in bulk substrates using sinker technologies. Further, the junction between P-type doped region 22 and N-type floating buried layer region 13 behaves more like a one-dimensional junction, which increases breakdown performance. Moreover, semiconductor substrate 11 has higher thermal conductivity performance and less capacitive coupling compared to SOI substrates. Further, isolation device 51 is provided to reduce the effects of a parasitic MOSFET device triggered by trench isolation structure 20, and isolation device 55 is provided to delay the triggering of an SCR device formed between N-type body structure 261 (or any other N-type region within P-type doped region 22), P-type doped region 22, N-type floating buried doped region 13, and semiconductor region 12. Isolation devices 51 and 55 thereby improve the performance and reliability of semiconductor devices using a self-isolating bulk substrate.

In a further embodiment, the self-isolating bulk semiconductor substrate consists essentially of a floating buried doped region of a first conductivity type, a doped region of a second conductivity type disposed between the floating buried doped region and the first major surface, and a semiconductor region of the second conductivity type disposed between the floating buried doped region and the second major surface.

In view of the above, it is evident that a novel device structure and method is disclosed. Included, among other features, is providing a self-isolating bulk semiconductor substrate that includes a floating buried doped region of a first conductivity type disposed between a doped region of a second conductivity type and a semiconductor region of the second conductivity type. In one embodiment, the first conductivity type is N-type and the second conductivity type is P-type. A trench isolation structure is provided that extends through the doped region and the floating buried doped region and extends into the semiconductor region to provide an active region. The floating buried doped region abuts or adjoins the trench isolation structure and is provided absent any structures that provide direct ohmic or direct low-ohmic electrical contact to it. A first isolation device is disposed within the doped region and, in one embodiment comprises a lateral PNP structure that is, at least in part, electrically shorted together. The lateral PNP structure is configured to divert current injected within the device thereby delaying the triggering an internal SCR device. In addition, a second isolation device is disposed within the doped region proximate to the trench isolation structure and is configured to reduce the effects of an internal MOSFET device. The isolation devices thereby improve device reliability and performance. The present method and structure further enhance design flexibility and are adapted to easily integrate into exiting process flows.

While the subject matter of the invention is described with specific preferred embodiments and example embodiments, the foregoing drawings and descriptions thereof depict only typical embodiments of the subject matter, and are not therefore to be considered limiting of its scope. It is evident that many alternatives and variations will be apparent to those skilled in the art. For example, the embodiments disclosed herein can be used with an SOI bulk substrate structure.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and meant to form different embodiments as would be understood by those skilled in the art.

What is claimed is:

1. A semiconductor device structure comprising:
   a self-isolating bulk semiconductor substrate having first and second opposing major surfaces, wherein the self-isolating bulk semiconductor substrate includes:
   a floating buried doped region of a first conductivity type;
   a first doped region of a second conductivity type opposite to the first conductivity type disposed between the floating buried doped region and the first major surface, wherein the first doped region abuts the floating buried doped region; and
   a semiconductor region of the second conductivity type disposed between the floating buried doped region and the second major surface;
   a trench isolation structure extending from the first major surface through the first doped region, extending through the floating buried doped region, and extending into the semiconductor region, wherein the floating buried doped region abuts the trench isolation structure;
   a second doped region of the first conductivity type within the first doped region; and
   a first isolation device disposed in the first doped region between the second doped region and the trench isolation structure, the first isolation device comprising:
   a first isolation first doped region of the first conductivity type; and
   a first isolation second doped region of the second conductivity type disposed between the second doped region and the first isolation first doped region, wherein the first isolation first doped region is electrically shorted to the first isolation second doped region.

2. The structure of claim 1, wherein the first isolation device further comprises a first isolation third doped region of the second conductivity type disposed between the first isolation first doped region and the trench isolation structure.

3. The structure of claim 2, wherein the first isolation third doped region is electrically shorted to the first isolation first doped region and the first isolation second doped region.

4. The structure of claim 2, wherein:
   the trench isolation structure comprises a conductive material separated from the self-isolating bulk semiconductor substrate by a dielectric material; and
   the structure further comprises a second isolation device disposed between the first isolation device and the trench isolation structure, the second isolation device comprising a second isolation first doped region of the second conductivity type.

5. The structure of claim 4, wherein the second isolation first doped region extends to greater depth into the first doped region than the first isolation second doped region and the first isolation third doped region.

6. The structure of claim 4, wherein the second isolation first doped region abuts a side surface of the trench isolation structure.

7. The structure of claim 4, wherein the second isolation first doped region is laterally spaced apart from a side surface of the trench isolation structure.

8. The structure of claim 4, wherein the first isolation third doped region laterally overlaps at least a portion of the second isolation first doped region.

9. The structure of claim 4, wherein the second isolation first doped region, the first isolation first doped region, the first isolation second doped region, and the first isolation third doped region are electrically shorted together.

10. The structure of claim 4, wherein the second isolation first doped region is electrically floating.

11. The structure of claim 1 further comprising a second isolation device, the second isolation device comprising a second isolation first doped region of the second conductivity type disposed between the first isolation device and the trench isolation structure, wherein the second isolation first doped region extends to a greater depth into the first doped region than the first isolation first doped region and the first isolation second doped region.

12. The structure of claim 1, wherein the floating buried doped region comprises:
   a first region adjoining the first doped region;
   a second region disposed between the first region and the semiconductor region, wherein the first region has a lower dopant concentration than the second region; and
   a third region disposed between the second region and the semiconductor region, wherein the third region has a lower dopant concentration than the second region.

13. A semiconductor device structure comprising:
   a self-isolating bulk semiconductor substrate having first and second opposing major surfaces, wherein the self-isolating bulk semiconductor substrate includes:
   a floating buried doped region of a first conductivity type;
   a first doped region of a second conductivity type opposite to the first conductivity type disposed between the floating buried doped region and the first major surface, wherein the first doped region abuts the floating buried doped region; and
   a semiconductor region of the second conductivity type disposed between the floating buried doped region and the second major surface;
   a trench isolation structure extending from the first major surface through the first doped region, extending through the floating buried doped region, and extending into the semiconductor region, wherein the floating buried doped region abuts the trench isolation structure;
   a second doped region of the first conductivity type within the first doped region; and
   a first isolation device disposed in the first doped region between the second doped region and the trench isolation structure, the first isolation device comprising:
   a first isolation first doped region of the first conductivity type;
   a first isolation second doped region of the second conductivity type disposed between the second doped region and the first isolation first doped region; and
   a first isolation third doped region of the second conductivity type disposed between the first isolation first doped region and the trench isolation structure, wherein the first isolation first doped region is electrically shorted to the first isolation second doped region.

14. The structure of claim 13, wherein:
   the trench isolation structure comprises a conductive material separated from the self-isolating bulk semiconductor substrate by a dielectric material; and
   the structure further comprises a second isolation device disposed between the first isolation device and the trench isolation structure, the second isolation device comprising a second isolation first doped region of the second conductivity type.

15. The structure of claim 14, wherein the first isolation third doped region is electrically shorted to the first isolation first doped region and the first isolation second doped region.

16. The structure of claim 15, wherein the first isolation third doped region laterally overlaps at least a portion of the second isolation first doped region.

17. A method of forming semiconductor device structure comprising:
providing a self-isolating bulk semiconductor substrate having first and second opposing major surfaces, wherein the self-isolating bulk semiconductor substrate includes:
a floating buried doped region of a first conductivity type;
a first doped region of a second conductivity type opposite to the first conductivity type disposed between the floating buried doped region and the first major surface, wherein the first doped region abuts the floating buried doped region; and
a semiconductor region of the second conductivity type disposed between the floating buried doped region and the second major surface;
providing a trench isolation structure extending from the first major surface through the first doped region, extending through the floating buried doped region, and extending into the semiconductor region, wherein the floating buried doped region abuts the trench isolation structure;
providing a second doped region of the first conductivity type within the first doped region; and
providing a first isolation device disposed in the first doped region between the second doped region and the trench isolation structure, the first isolation device comprising:

a first isolation first doped region of the first conductivity type;
a first isolation second doped region of the second conductivity type disposed between the second doped region and the first isolation first doped region; and
a first isolation third doped region of the second conductivity type disposed between the first isolation first doped region and the trench isolation structure, wherein the first isolation first doped region is electrically shorted to the first isolation second doped region.

18. The method of claim 17, wherein:
providing the trench isolation structure comprises a providing the trench isolation structure comprising a conductive material separated from the self-isolating bulk semiconductor substrate by a dielectric material; and
the method further comprises providing a second isolation device disposed between the first isolation device and the trench isolation structure, the second isolation device comprising a second isolation first doped region of the second conductivity type.

19. The method of claim 18, wherein providing the first isolation third doped region comprises providing the first isolation third doped region electrically shorted to the first isolation first doped region and the first isolation second doped region.

20. The method of claim 18, wherein providing the first isolation third doped region comprises providing the first isolation third doped region laterally overlapping at least a portion of the second isolation first doped region.

* * * * *